United States Patent [19]

Mii

[11] Patent Number: 4,979,017
[45] Date of Patent: Dec. 18, 1990

[54] SEMICONDUCTOR ELEMENT STRING STRUCTURE

[76] Inventor: Adam Mii, 3 Fl., No. 1, Fu Hsing N. Rd., Taipei, Taiwan

[21] Appl. No.: 314,713

[22] Filed: Feb. 23, 1989

[51] Int. Cl.⁵ .............................................. H01L 23/48
[52] U.S. Cl. .......................................... 357/70; 357/68
[58] Field of Search ............................ 357/17, 70, 68

[56] References Cited

U.S. PATENT DOCUMENTS

| | | | |
|---|---|---|---|
| 3,558,994 | 1/1971 | Bernstein | 357/68 |
| 3,606,673 | 9/1971 | Overman | 357/68 |
| 3,660,669 | 5/1972 | Grenon | 357/72 |
| 3,893,158 | 7/1975 | Lincoln | 357/68 |
| 3,914,786 | 10/1975 | Grossi | 357/68 |
| 3,916,433 | 10/1975 | Schierz | 357/68 |
| 4,152,624 | 5/1979 | Knaebel | 357/72 |
| 4,532,538 | 7/1985 | Wurz | 351/68 |
| 4,616,250 | 10/1986 | Folk | 357/70 |
| 4,633,582 | 1/1987 | Ching et al. | 357/70 |

FOREIGN PATENT DOCUMENTS

| | | | |
|---|---|---|---|
| 0133383 | 11/1978 | Japan . | |
| 0019155 | 1/1986 | Japan | 357/70 |
| 0219647 | 9/1987 | Japan . | |
| 0156346 | 6/1988 | Japan | 357/70 |
| 2031650 | 4/1980 | United Kingdom | 357/70 |

Primary Examiner—Andrew J. James
Assistant Examiner—Viet Q. Nguyen
Attorney, Agent, or Firm—Steinberg & Raskin

[57] ABSTRACT

A semiconductor element string having a number of semiconductor elements mounted on a lead frame. The lead frame has a transverse plate, an assembling plate and a number of first and second leads respectively connected to the transverse plate and the assembling plate. The lead frame is used to form the semiconductor element string by soldering the semiconductor elements on the end portions of the first and second leads. When forming the semiconductor element string, one of the leads of each of the semiconductor elements in the string is connected to the transverse plate.

3 Claims, 5 Drawing Sheets

4,979,017

SEMICONDUCTOR ELEMENT STRING STRUCTURE

BACKGROUND OF THE INVENTION

This invention relates to a semiconductor element string structure, and more particularly, to a light emitting diode (LED) string which can be used for a display board or the like. During the manufacture of the LED strings, both leads of a plurality of the LED chips are connected with a transverse plate to form a semiconductor element string. After the LEDs are furnished, one lead of each LED chip is cut off from the transverse plate and another lead is still connected to the transverse plate. Therefore, such an LED string can be conveniently positioned to a printed circuit board in order to increase its assembling rate, thus not only decreasing the number of necessary connections to the printed circuit board but also simplifying the design of the printed circuit boards.

As is well known in conventional techniques, LEDs have often been formed as a single element. When used to form a large LED display, it is necessary to position all of the LEDs on a circuit board and make necessary electrical connections. However, this arrangement has two major drawbacks:

1. It takes a lot of time to assemble the separate LEDs into a large LED display and is therefore inefficient for use in forming such a display.
2. The ciruit board used to position every LED thereon is very complicated in its circuit layout. For example, if there are 400 LEDs on the board, then it is necessary to connect 800 pins into a desired matrix form and to align the LEDs in a correct position. The work of the assemblage is obviously difficult and expensive. Moreover, it is very difficult to connect so many pins on a one-layer circuit board, and of course, the cost of manufacturing is greatly increased.
3. All the LEDs cannot be easily aligned with one another. The inappropriate assemblage of LEDs on the board tend to cause the LEDs to misalign with one another.

It is, therefore, the purpose of this invention to mitigate and/or obviate the above-mentioned drawbacks in the manner set forth in the detailed description of the preferred embodiment.

SUMMARY OF THE INVENTION

A primary objective of this invention is to provide a semiconductor element string, in which a plurality of semiconductor elements are made into a semiconductor element string by connecting one lead of each semiconductor element to a transverse plate; therefore, the number of necessary connections to the printed circuit board is greatly decreased when it is desired to mount a large number of the semiconductor elements on the printed circuit board.

Another objective of this invention is to provide a semiconductor element string by which all the semiconductor elements can be easily positioned and can be neatly aligned.

Further objectives and advantages of this invention will become apparent as the following decription proceeds, and the features of novelty which characterize the invention will be pointed out with particularity in the claims annexed to and forming a part of this invention.

DETAILED DESCRIPTION OF THE PREFERRED EMBODIMENT

Figure 1:
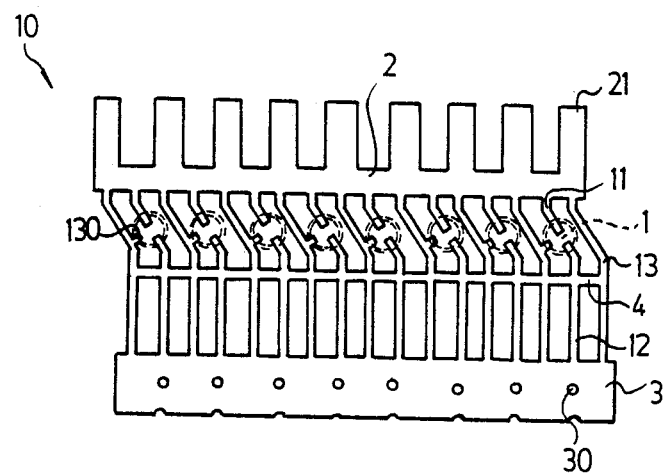
FIG. 1 is a plan view of a lead frame of a semiconductor element string in accordance with the present invention in an unfolded position.

With reference to the drawings and particularly to FIG. 1 thereof, it can be seen that a lead frame 10 in accordance with the present invention substantially comprises a transverse plate 2, an assembling plate 3 and a plurality of first and second leads 11 and 12, in which the first leads 11 are electrically connected to the transverse plate 2, and the second leads are electrically connected to the assembling plate 3.

Between the end portions of a pair of the first and second leads 11 and 12, a semiconductor element 1 indicated in dotted circles is soldered on the ends thereof by a bonder (not shown), in which the end portions thereof are slanted and in alignment with each other. Corresponding to each of the semiconductor elements, the transverse plate 2 has a respective protruding piece 21 to be connected to a respective first lead 11. The assembling plate 3 has an assembling hole 30 so as to facilitate the automatic manufacturing process.

Parallel to each pair of the first and second leads 11 and 12, a third lead 13 with a tap 130 is interposed between the transverse plate 2 and the assembling plate 3 to either serve as a lead of a semiconductor element with three leads by adhering the tap 130 to the semiconductor element or to reinforce the configuration of the lead frame if the semiconductor element has only two leads. Moreover, parallel to the assembling plate 3, a linking piece 4 is provided crossing over respective middle portions of the second and third leads 12 and 13 so as to make the whole construction more stable.

Figure 2:
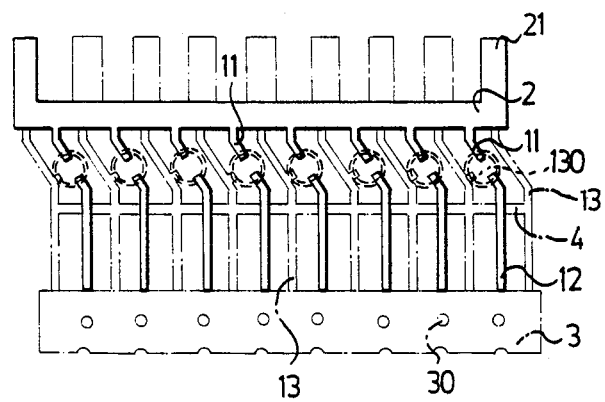
FIG. 2 is a plan view of the lead frame in unfolded position, in which the unnecessary portions indicated in dotted lines are cut off from the lead frame, and the remaining portions indicated in solid lines are used to form the semiconductor element string.
Figure 3:
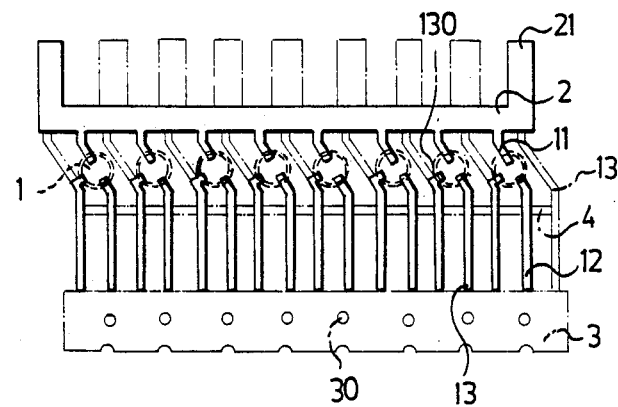
FIG. 3 is a plan view, similar to FIG. 2, of the lead frame, but wherein the semiconductor elements have three leads.

When forming the structure of this invention, the protruding pieces 21 are cut off from the transverse plate 2, excepting two protruding pieces 20 which are, not exclusively, the outermost protruding pieces 20, as shown in FIG. 2. Each second lead 12 is cut off from the assembling plate 3, and each third lead 13 is cut off from the transverse piece 2, if the semiconductor elements have two leads; for example, LEDs. Moreover, the linking piece 4 is cut off from all the second leads 12 to isolate the second leads 12 of the semiconductor elements from one another. Further referring to FIG. 3, another preferred embodiment is shown similar to that in FIG. 2, but all of the third leads 13 with the taps 130 soldered on the corresponding semiconductor elements are cut off from the assembling plate 3 and the transverse plate 2, since the semiconductor elements have three leads. As mentioned above, the unnecessary portions indicated in dotted lines are cut off from the lead frame 10, and the remaining portions indicated in solid lines are used to form the semiconductor element string of this invention.

Figure 4:
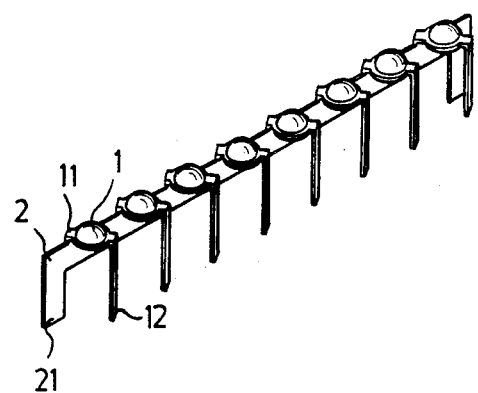
FIG. 4 is a perspective view of a preferred embodiment with respect to FIG. 2, in which the lead frame is in folded position.

After the work of cutting off all the unnecessary portions from the lead frame 10, all of the first and second leads 11 and 12 are folded to bend 90 degrees in a manner that the semiconductor elements 1 with the slanted portions of the first and second leads 11 and 12 are juxtaposed to one another, as shown in FIG. 4. This results in facilitating the assemblage of the semiconductor elements. Obviously, the remaining protruding pieces 21 face downward with respect to the semiconductor elements 1 and can be inserted into a circuit board. It should be noted that the number of the semiconductor elements to used form a semiconductor element string is not exclusive and is dependent on the actual requirements.

Figure 5:
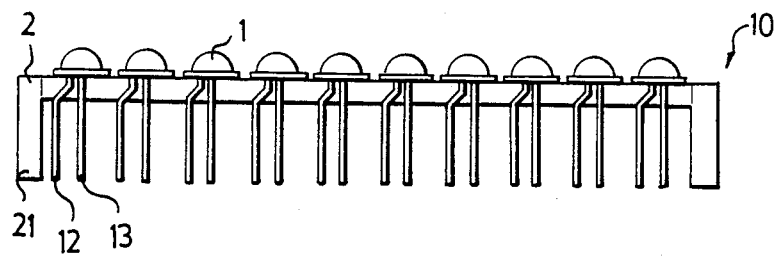
FIG. 5 is a perspective view of another preferred embodiment with respect to FIG. 3, in which the semiconductor elements have three leads, and the lead frame is in folded position.
Figure 6:
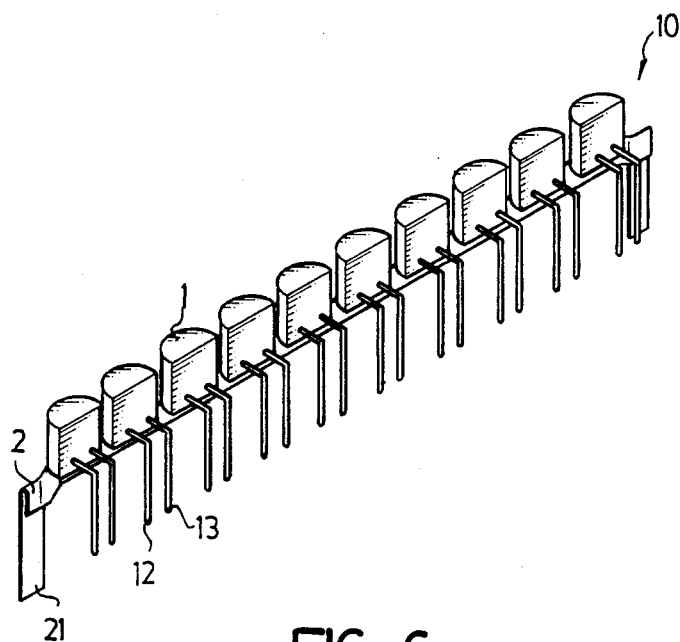
FIG. 6 is a perspective view, similar to FIG. 5 of another preferred embodiment, in which the semiconductor elements have three leads.

Further, similar to the embodiment shown in FIG. 4, other preferred embodiments of the semiconductor elements with three leads are illustrated in FIG. 5, in which two LED chips are contained in every semiconductor element and can emit two different colors of light. In this situation there are three connecting leads 11, 12 and 13 (the first lead 11 of which is not shown), with the first lead 11 connected to the transverse plate 2 and serving as the common line. In addition, this structure can be applied with transistors too, as demonstrated in FIG. 6. According to the semiconductor element string, all of the first leads 11 are connected to one another by the transverse plate 2, thus greatly decreasing the number of necessary connections to the printed circuit board (i.e., one half of the original number).

Figure 7:
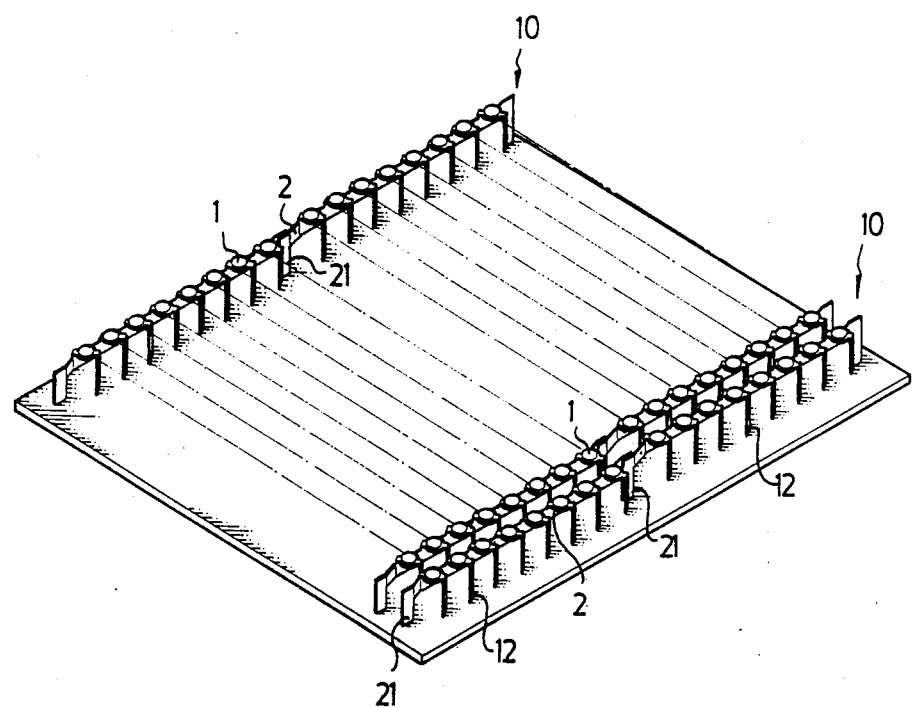
FIG. 7 is a perspective view of a large display, on which a plurality of the semiconductor element strings of the present invention are mounted.

When mounting the semiconductor element string on the printed circuit board, the transverse plate 2 is fixed thereon and causes all the semiconductor elements to be positioned at the same level. Furthermore, the transverse plate 2 also has the effect of further securing the connections of the semiconductor elements on the printed circuit board, whereby the large LED display is formed effectively as well as efficiently. Please note that each end of the transverse plate 2 can be bent inward or outward, so that two or more semiconductor element strings can be aligned and overlap with each other, as shown in FIG. 7.

As can be seen from the above description, this invention provides a semiconductor element string which not only greatly reduces the time needed for the assemblage of the semiconductor elements into a printed circuit board, but also significantly simplifies the design of the printed circuit board in connection with the large display. That is, the present invention provides the following advantages:

(1) Provides easier and more convenient fabrication than previously possible since a series of the semiconductor elements are mounted together in actual use;

(2) Simplifies circuit design by previously connecting one lead of all the semiconductor elements in a string as the ground line. This results in reducing the points required to be soldered and reducing a lot of connections to the printed circuit board as the groound lines for respective semiconductor elements;

(3) Enhances security of the connections of the semiconductor elements on a printed circuit board, since the semiconductor elements are connected to the transverse plate. This reduces a lot of connecting contacts which require inspection; and (4) It is convenient to multiply the amount of the semiconductor elements by contacting the end portions of the transverse plates.

Various possible embodiments might be made of the above invention without departing from the scope of the invention; for example, the light emitting diode may be substituted by transistor. It is to be understood that all matter herein described or shown in the accompanying drawings is to be interpreted as illustrative and not in a limiting sense. Thus it will be appreciated that the drawings are exemplary of a preferred embodiment of the invention and that the scope of the invention is to be limited only by the scope of the appended claims.

I claim:

1. A semiconductor element string comprising:
a lead frame and a plurality of semiconductor elements arranged thereon in an array,
said lead frame comprising
a transverse plate at one side of said array of semiconductor elements and an assembling plate at the other side thereof,
said lead frame further comprising, corresponding to each of said semiconductor elements,
a first lead bridging said semiconductor element and said transverse plate,
a second lead bridging said semiconductor element and said assembling plate, and
a third lead which is respectively connected to said semiconductor element, said transverse plate and said assembling plate,
said lead frame further comprising
a linking piece between said array of semiconductor elements and said assembling plate, said linking piece interconnecting all said second leads and said third leads.

2. The semiconductor element string according to claim 1, wherein each of said semiconductor elements has two functional terminals, respectively corresponding to said first lead and said second lead.

3. The semiconductor element string according to claim 1, wherein each of said semiconductor elements has three functional terminals, respectively corresponding to said first, second and third leads.

* * * * *